United States Patent
Saki

(10) Patent No.: US 9,852,911 B2
(45) Date of Patent: Dec. 26, 2017

(54) FIELD EFFECT TRANSISTOR

(71) Applicant: KABUSHIKI KAISHA TOSHIBA, Tokyo (JP)

(72) Inventor: Kazuo Saki, Kanazawa Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/831,233

(22) Filed: Aug. 20, 2015

(65) Prior Publication Data

US 2016/0268389 A1 Sep. 15, 2016

(30) Foreign Application Priority Data

Mar. 12, 2015 (JP) ................................. 2015-049047

(51) Int. Cl.
| | |
|---|---|
| *H01L 29/43* | (2006.01) |
| *H01L 21/28* | (2006.01) |
| *H01L 29/40* | (2006.01) |
| *H01L 29/51* | (2006.01) |
| *H01L 29/778* | (2006.01) |

(Continued)

(52) U.S. Cl.
CPC .... *H01L 21/28264* (2013.01); *H01L 21/0234* (2013.01); *H01L 21/02326* (2013.01); *H01L 21/3105* (2013.01); *H01L 29/404* (2013.01); *H01L 29/432* (2013.01); *H01L 29/518* (2013.01); *H01L 29/66318* (2013.01);

(Continued)

(58) Field of Classification Search
CPC ............. H01L 29/432; H01L 29/66318; H01L 29/66431; H01L 29/66469
See application file for complete search history.

(56) References Cited

U.S. PATENT DOCUMENTS 7,501,669 B2 * 3/2009 Parikh .................. H01L 29/812
257/192
7,910,955 B2 3/2011 Endoh et al.
(Continued)

FOREIGN PATENT DOCUMENTS

JP 2013-191828 A 9/2013

OTHER PUBLICATIONS

Taiwanese Office Action dated Jul. 6, 2016, filed in Taiwan counterpart Patent Application No. 104129059, 6 pages (with English translation).

*Primary Examiner* — Phat X Cao
(74) *Attorney, Agent, or Firm* — Patterson & Sheridan, LLP

(57) ABSTRACT

A semiconductor device includes a semiconductor layer, a first electrode located over the semiconductor layer and connected to the semiconductor layer, a second electrode spaced from the first electrode and located over the semiconductor layer and connected to the semiconductor layer, an insulation film located over the semiconductor layer, and a third electrode interposed between the first electrode and the second electrode, and location over a portion of the insulation film. The insulation film includes a first layer located on the semiconductor layer and between the first electrode and the second electrode and comprising silicon nitride, and a second layer located on the first layer and between the first electrode and the third electrode as well as between the second electrode and the third electrode, and comprising silicon nitride and an amount of oxygen larger than the first layer.

13 Claims, 3 Drawing Sheets

(51) Int. Cl.
*H01L 29/66* (2006.01)
*H01L 21/02* (2006.01)
*H01L 21/3105* (2006.01)
*H01L 29/20* (2006.01)

(52) U.S. Cl.
CPC .... *H01L 29/66431* (2013.01); *H01L 29/7787* (2013.01); *H01L 29/2003* (2013.01)

(56) References Cited

U.S. PATENT DOCUMENTS

| | | |
|---|---|---|
| 8,963,203 B2 | 2/2015 | Kuraguchi et al. |
| 2006/0011915 A1* | 1/2006 | Saito ................... H01L 29/1066 257/65 |
| 2006/0102929 A1* | 5/2006 | Okamoto .............. H01L 29/402 257/189 |
| 2007/0018199 A1* | 1/2007 | Sheppard .......... H01L 29/42316 257/200 |
| 2007/0249119 A1 | 10/2007 | Saito |
| 2007/0267655 A1 | 11/2007 | Endoh et al. |
| 2013/0193485 A1* | 8/2013 | Akiyama .......... H01L 29/66431 257/194 |
| 2016/0079066 A1* | 3/2016 | Takada ................ H01L 21/283 257/409 |

* cited by examiner

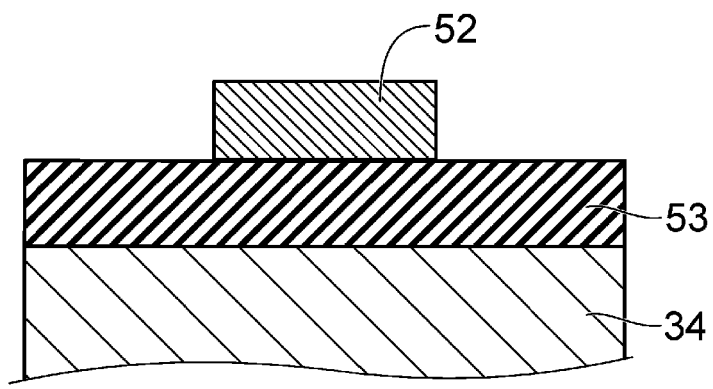
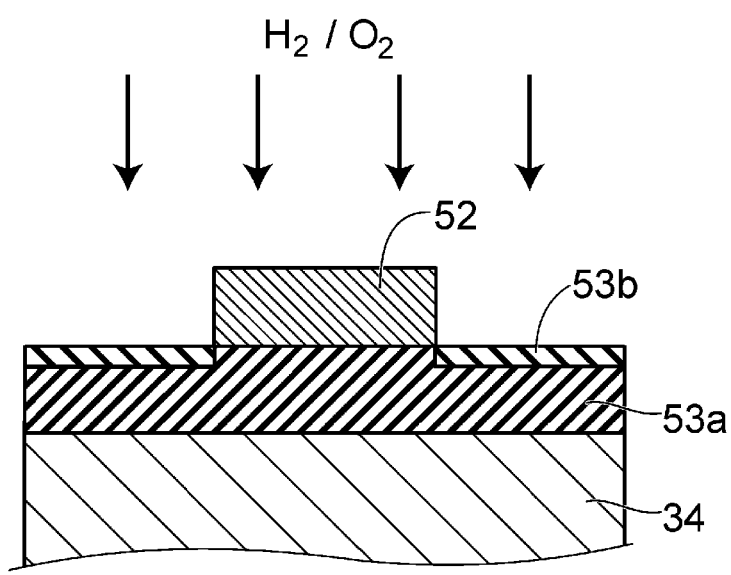

FIELD EFFECT TRANSISTOR

CROSS-REFERENCE TO RELATED APPLICATION

This application is based upon and claims the benefit of priority from Japanese Patent Application No. 2015-049047, filed Mar. 12, 2015, the entire contents of which are incorporated herein by reference.

FIELD

An embodiment described herein relates to a semiconductor device.

BACKGROUND

As a semiconductor material where lowering of electron mobility in a high electric field may be suppressed, a wide band gap semiconductor has been used. For example, in a semiconductor device which uses a nitride semiconductor, an electron current generated by a two-dimensional electron gas may be controlled based on a potential of a gate electrode. A gate insulation film is interposed between the gate electrode and the nitride semiconductor. In such a semiconductor device, a highly reliable gate insulation film is required for achieving operation of the semiconductor device at a high voltage.

In manufacturing, the material from which the gate electrode is formed is disposed on the gate insulation film, and the gate electrode material is pattern etched using reactive ion etching to define the gate electrode out of the gate electrode material layer. However, when forming the gate electrode by plasma etching, the gate insulation film is exposed to ion bombardment from the plasma thus giving rise to a possibility that a defect occurs in the gate insulation film. In this case, the insulation property of the gate insulation film is lowered.

DESCRIPTION OF THE DRAWINGS

FIG. 2A to FIG. 2C are cross-sectional views schematically showing manufacturing steps of the gate electrode according to the embodiment.

DETAILED DESCRIPTION

Figure 1A:
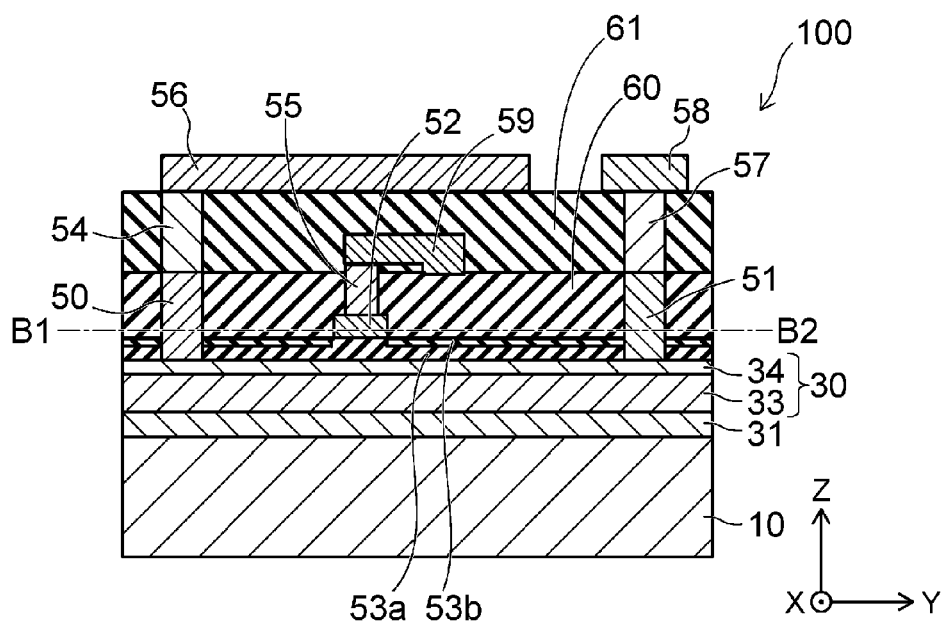
FIG. 1A is a cross-sectional view schematically showing a main portion of a semiconductor device according to an embodiment.

According to an embodiment, there is provided a semiconductor device where the lowering of the insulating property of a gate insulation film may be suppressed.

In general, according to one embodiment, a semiconductor device includes a semiconductor layer, a first electrode located over the semiconductor layer and connected to the semiconductor layer, a second electrode spaced from the first electrode and located over the semiconductor layer and connected to the semiconductor layer, an insulation film located over the semiconductor layer, and a third electrode interposed between the first electrode and the second electrode and located over a portion of the insulation film. The insulation film comprises a first layer located on the semiconductor layer and between the first electrode and the second electrode and comprising silicon nitride, and a second layer located on the first layer and between the first electrode and the third electrode as well as between the second electrode and the third electrode, and comprising silicon nitride and oxygen.

Hereinafter, an embodiment is explained by reference to drawings. In the explanation made hereinafter, identical elements are given the same symbols, and a repeated explanation thereof is omitted when appropriate with respect to an element which has been already described. There may be a case where a three-dimensional coordinate system is introduced in the drawings.

Figure 1B:
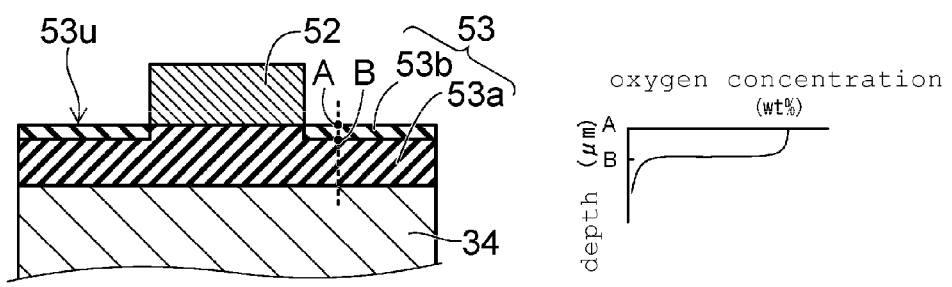
FIG. 1B is a cross-sectional view schematically showing a gate electrode of the semiconductor device according to the embodiment and an area around the gate electrode.
Figure 1C:
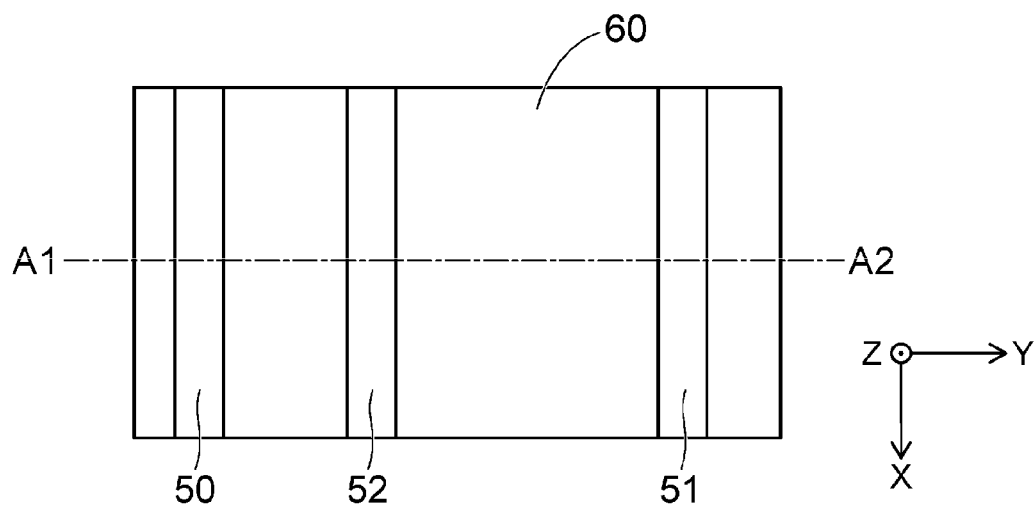
FIG. 1C is a plan view schematically showing the main portion of the semiconductor device according to the embodiment.

FIG. 1A is a cross-sectional view schematically showing a main portion of a semiconductor device according to an embodiment. FIG. 1B is a cross-sectional view schematically showing a gate electrode of the semiconductor device according to the embodiment and an area around the gate electrode. FIG. 1C is a plan view schematically showing the main portion of the semiconductor device according to the embodiment.

FIG. 1A shows a cross section taken along a line A1-A2 in FIG. 1C. FIG. 1C shows a cross section taken along a line B1-B2 in FIG. 1A. Further, FIG. 1B also shows a profile of oxygen concentration between points A and B on the right-hand side of FIG. 1B.

As one example of a semiconductor device 100 according to this embodiment, a HEMT (High Electron Mobility Transistor) is exemplified. The semiconductor device 100 according to this embodiment includes: a semiconductor substrate 10; a buffer layer 31; a semiconductor layer 30; a first electrode (hereinafter, for example, a source electrode 50); a second electrode (hereinafter, for example, a drain electrode 51); an insulation film (hereinafter, for example, a gate insulation film 53); and a third electrode (hereinafter, for example, a gate electrode 52).

A semiconductor substrate 10 comprises silicon (Si), for example. A buffer layer 31 is formed over the semiconductor substrate 10. The buffer layer 31 comprises aluminum nitride.

The semiconductor layer 30 includes: a carrier transit layer 33 formed over the buffer layer 31; and a barrier layer 34 formed over the carrier transit layer 33. The carrier transit layer 33 comprises non-doped gallium nitride (GaN) or non-doped aluminum nitride gallium ($Al_xGa_{1-x}N$ ($0 \leq X < 1$)) through which current may flow between the source electrode 50 and drain electrode 51 in dependence on the voltage applied to the gate electrode 52. The barrier layer 34 comprises non-doped or n-type aluminum nitride gallium ($Al_yGa_{1-y}N$ ($0 \leq Y < 1$, $X < Y$)) in a different composition than the carrier transit layer 33. A two-dimensional electron gas (2DEG) is generated in the carrier transit layer 33 in the vicinity of a boundary between the carrier transit layer 33 and the barrier layer 34.

The source electrode 50 is formed over the semiconductor layer 30. The source electrode 50 is connected to the semiconductor layer 30. The source electrode 50 is in ohmic contact with the barrier layer 34. The source electrode 50 extends in the X direction, for example.

The drain electrode 51 is formed over the semiconductor layer 30. The drain electrode 51 is connected to the semiconductor layer 30. The drain electrode 51 is in ohmic contact with the barrier layer 34. The drain electrode 51 is disposed on a side of the source electrode 50 in the Y direction. The drain electrode 51 extends in the X direction.

The gate electrode 52 is disposed between the source electrode 50 and the drain electrode 51. The gate electrode 52 is formed over the semiconductor layer 30 with the gate insulation film 53 located therebetween. The gate electrode 52 extends in the X direction, for example.

The gate insulation film 53 is formed over the semiconductor layer 30. The gate insulation film 53 includes: a first layer 53a; and a second layer 53b which is selectively formed over the first layer 53a. The first layer 53a contains silicon nitride ($SiN_x$). The first layer 53a extends between the source electrode 50 and the drain electrode 51 on one side of the semiconductor layer 30.

The second layer 53b is formed over the first layer 53a and extends between the source electrode 50 and the gate electrode 52 as well as between the drain electrode 51 and the gate electrode 52, such that the gate electrode 52 extends therethrough into contact with the first layer 53a. The second layer 53b contains silicon nitride ($SiN_x$) and oxygen (O). The second layer 53b contains a larger amount of oxygen than the first layer 53a The concentration of oxygen contained in the second layer 53b is set so that the concentration of oxygen on the side thereof facing the first layer 53a of the gate insulation film 53 is lower than the concentration of oxygen at the upper surface 53u side of the second layer 53b of the gate insulation film 53. For example, the concentration of oxygen contained in the second layer 53b becomes lower from the upper surface 53u in the direction of the first layer 53a.

The concentration of oxygen in the second layer 53b and the concentration of oxygen in the first layer 53a may be compared with each other using peak values or average values of the concentration of oxygen in the respective layers.

Further, in the semiconductor device 100, a protective layer 60 is formed over the gate insulation film 53. A protective layer 61 is formed over the protective layer 60. The protective layers 60, 61 contain silicon oxide, silicon nitride or the like, for example.

A contact electrode 54 is connected to the source electrode 50. A field plate electrode 56 is connected to the contact electrode 54. The field plate electrode 56 is formed over the protective layer 61.

A contact electrode 57 is connected to the drain electrode 51. An electrode 58 is connected to the contact electrode 57. The electrode 58 is formed over the protective layer 61.

A contact electrode 55 is connected to the gate electrode 52. A field plate electrode 59 is connected to the contact electrode 55. The field plate electrode 59 is formed over the protective layer 60.

The number of source electrodes 50, the number of drain electrodes 51, and the number of gate electrodes 52 are not limited to the numbers of these components shown in the drawing.

Figure 2A:
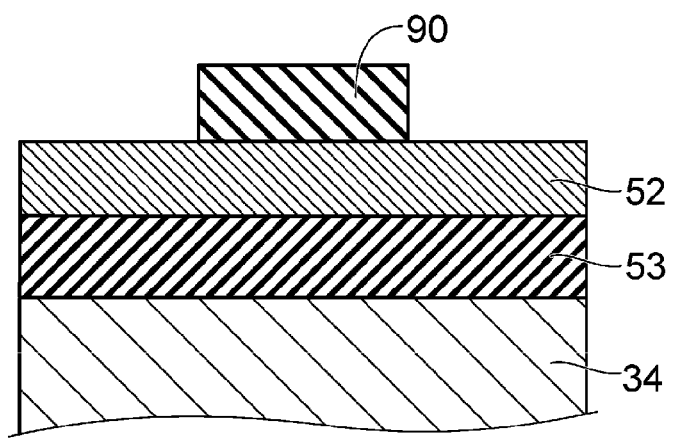

FIG. 2A to FIG. 2C are cross-sectional views schematically showing manufacturing steps of the gate electrode according to this embodiment.

For example, as shown in FIG. 2A, the gate insulation film 53 is formed over the barrier layer 34 by low-pressure CVD (Chemical Vapor Deposition). The film thickness of the gate insulation film 53 is 20 nm, for example. Next, the gate electrode 52 material is formed over the whole surface of the gate insulation film 53 by PVD (Physical Vapor Deposition). A film thickness of the gate electrode 52 is 50 nm. The gate electrode 52 contains titanium nitride (TiN). Next, a mask layer 90 is selectively formed over the gate electrode 52 material.

Next, as shown in FIG. 2B, a portion of the gate electrode 52 material which is exposed by openings in the mask layer 90 is removed by RIE (Reactive Ion Etching). When the gate electrode 52 material exposed by openings in the mask layer 90 is removed from the gate insulation film 53, the exposed gate insulation film 53 is exposed to the etch plasma.

Due to such an exposure, there is a possibility that a defect occurs on or adjacent to the surface of the gate insulation film 53. Such a defect includes, for example, a dangling bond that is generated by breaking a bond between silicon (Si) and nitrogen (N).

Next, as shown in FIG. 2C, a mixed gas containing hydrogen ($H_2$) and oxygen ($O_2$) is dissociated, and a plasma gas containing hydrogen and oxygen is exposed to the surface layer of the gate insulation film 53. Here, a flow rate ratio of hydrogen ($H_2$) to oxygen ($O_2$) is set to 10:1 as an example. A pressure of the mixed gas of hydrogen ($H_2$) and oxygen ($O_2$) is set to 100 Pa as one example.

Further, there may be a case where a temperature of the gate insulation film 53 is set to 500° C. as one example, and a mixed gas containing hydrogen ($H_2$) and oxygen ($O_2$) is exposed to the surface layer of the gate insulation film 53. In this case, a flow rate ratio of hydrogen ($H_2$) to oxygen ($O_2$) is set to 20:1 as an example. A pressure of a mixed gas of hydrogen ($H_2$) and oxygen ($O_2$) is set to 100 Pa as one example.

Due to such a process, for example, oxygen is bonded to a dangling bond in the gate insulation film 53 so that a defect is terminated by oxygen. That is, a defect d in the gate insulation film 53 is repaired. The oxygen also penetrates inwardly of the insulation film 53 to form the second layer 53b, such that the concentration of oxygen in the second layer 53b is higher at the outer surface 53u thereof exposed to the oxygen and lower at the interface of the lower surface of the second layer 53b and the first layer 53a. Additionally, because the gate electrode 51 covers the insulating film 53, the oxygen diffusing or entering the insulating film to form the second layer 53b does not significantly penetrate the portion of the insulation film 53 extending between the gate electrode 52 and the semiconductor layer 30, and thus a self-aligned, with the gate electrode, second layer 53b is formed on the first layer 53a, and the second layer does not significantly extend between the gate electrode 52 and the semiconductor layer 30 and thus the gate insulator properties of the insulation film 53 comprising, in the embodiment silicon nitride, are maintained in the region between the gate electrode 52 and the semiconductor layer 30.

The mixed gas containing oxygen is also exposed to the gate electrode 52. However, even when the gate electrode 52 is exposed to oxygen, due to the presence of hydrogen in the mixed gas, oxidation and reduction repeatedly take place on the surface of the gate electrode 52 and hence, the gate electrode 52 is not eventually oxidized. Further, the resistance of the gate electrode 52 is not increased after this process.

Here, assume the case where the process shown in FIG. 2C is not performed. In this case, a defect remains on a surface layer of the gate insulation film 53. The field plate electrode 59 is formed over the gate electrode 52. When a high voltage is applied between the field plate electrode 59 and the drain electrode 51, a high voltage is applied also between the semiconductor layer 30 which is connected to the drain electrode 51 and the field plate electrode 59.

When a defect exists in the gate insulation film 53 between the semiconductor layer 30 and the field plate electrode 59, a high voltage is also applied to an area in the vicinity of the defect. Here, for example, the defect includes a dangling bond where bonding between silicon and nitrogen is broken. Due to the application of a high voltage, there is a possibility that dielectric breakdown can occur in the gate insulation film 53.

Additionally, when a defect exists in the gate insulation film 53, carriers (electrons) are trapped by the defect when the device is in an ON state, for example. Accordingly, the two-dimensional electron gas is reduced so that an ON resistance of the semiconductor device 100 is increased.

On the other hand, in this embodiment, a defect in the gate insulation film 53 is repaired by oxygen. Accordingly, even when a high voltage is applied between the semiconductor layer 30 and the field plate electrode 59, the insulation properties of the gate insulation film 53 may be maintained so that dielectric breakdown of the gate insulation film 53 minimally occurs.

Further, a defect in the gate insulation film 53 is repaired and hence, carriers (electrons) are minimally trapped by the gate insulation film 53 when the device is in an ON state. Accordingly, the two-dimensional electron gas is not reduced by a defect and hence, the ON resistance of the semiconductor device 100 is not increased.

In the above-mentioned embodiment, "formed over" in the expression "A is formed over B" may be used, besides the case where A is formed over the B in a state where the A is in contact with B, in the case where A is formed over the B in a state where the A is not in contact with B. Further, "A is formed over B" may be used in the case where A and B are inverted so that A is positioned below B and the case where A and B are disposed parallel to each other in the lateral direction. This is because even when the semiconductor device according to the embodiment is rotated, the structure of the semiconductor device is not changed before and after the rotation.

The exemplary embodiment has been explained by reference to the specific examples heretofore. However, the exemplary embodiment is not limited to these specific examples. That is, examples which are prepared by adding suitable design changes to these specific examples by those skilled in the art may be also embraced in the category of the exemplary embodiment as long as these examples also include the technical features of the embodiment. The configurational elements which the above-mentioned respective specific examples include and the dispositions, the materials, the conditions, the shapes, the sizes and the like of these configurational elements are not limited to the exemplified values and may be suitably changed.

Further, the respective configurational elements which the above-mentioned respective embodiments include may be combined with each other provided that such combinations are technically feasible, and these combinations are also embraced in the scope of the exemplary embodiments provided that these combinations also include the technical features of the exemplary embodiments. Still further, various variations and modifications are conceivable to those who are skilled in the art within a category of the technical concept of the exemplary embodiments, and it is construed that these variations and modifications also fall within the scope of the present invention.

While certain embodiments have been described, these embodiments have been presented by way of an example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer;
   a first electrode located over the semiconductor layer and connected to the semiconductor layer;
   a second electrode spaced from the first electrode and located over the semiconductor layer and connected to the semiconductor layer;
   an insulation film located over the semiconductor layer; and
   a third electrode interposed between the first electrode and the second electrode and located over a portion of the insulation film, wherein
   the insulation film comprises:
   a first layer comprising silicon nitride located on the semiconductor layer and between the first electrode and the second electrode, the first layer in contact with a portion of a lower surface of the third electrode; and
   a second layer located on the first layer and between the first electrode and the third electrode as well as between the second electrode and the third electrode, and comprising silicon nitride and oxygen, an upper surface of the second layer substantially located in the same plane as the portion of the lower surface of the third electrode.

2. The semiconductor device according to claim 1, wherein the concentration of oxygen in the second layer of the insulation film changes in the thickness direction of the second layer of the insulation film.

3. The semiconductor device according to claim 2, wherein the concentration of oxygen in the second layer of the insulation film is lower on a first side of the second layer of the insulation film adjacent to the first layer than the concentration of oxygen on a second surface of the second layer of the insulation film opposite to the first side of the second layer of the insulation film.

4. The semiconductor device according to claim 1, further comprising a first protective layer located over the second layer of the insulation film and a second protective layer located over the first protective layer.

5. The semiconductor device according to claim 4, further comprising a first field plate electrode connected to the third electrode, the first field plate electrode interposed between the first protective layer and the second protective layer.

6. The semiconductor device according to claim 5, further comprising a second field plate electrode located over the second protective layer and connected to the first electrode.

7. The semiconductor device of claim 1, wherein the second layer of the insulation film is self-aligned with the third electrode.

8. The semiconductor device according to claim 1, wherein the third electrode extends through the second layer of the insulation film and contacts the first layer of the insulation film.

9. A semiconductor device comprising:
   a semiconductor layer;
   a first electrode located over the semiconductor layer and connected to the semiconductor layer;
   a second electrode spaced from the first electrode and located over the semiconductor layer and connected to the semiconductor layer;

an insulation film located over the semiconductor layer; and a third electrode interposed between the first electrode and the second electrode and located over a portion of the insulation film, wherein the insulation film comprises:

a first layer comprising silicon nitride located on the semiconductor layer and between the first electrode and the second electrode, the first layer being in contact with a portion of a lower surface of the third electrode, and portions of the first electrode and the second electrode; and a second layer located on the first layer and between the first electrode and the third electrode as well as between the second electrode and the third electrode, and comprising silicon nitride and oxygen, an upper surface of the second layer substantially located in the same plane as the portion of the lower surface of the third electrode.

10. The semiconductor device according to claim 9, wherein the concentration of oxygen in the second layer of the insulation film changes in the thickness direction of the second layer of the insulation film.

11. The semiconductor device according to claim 10, wherein the concentration of oxygen in the second layer of the insulation film is lower on a first side of the second layer of the insulation film adjacent to the first layer than the concentration of oxygen on a second surface of the second layer of the insulation film opposite to the first side of the second layer of the insulation film.

12. The semiconductor device according to claim 9, further comprising a first protective layer located over the second layer of the insulation film and a second protective layer located over the first protective layer.

13. The semiconductor device according to claim 12, further comprising a first field plate electrode connected to the third electrode, the first field plate electrode interposed between the first protective layer and the second protective layer.

* * * * *